United States Patent
Feustel et al.

(10) Patent No.: US 8,368,221 B2
(45) Date of Patent: Feb. 5, 2013

(54) HYBRID CONTACT STRUCTURE WITH LOW ASPECT RATIO CONTACTS IN A SEMICONDUCTOR DEVICE

(75) Inventors: Frank Feustel, Dresden (DE); Kai Frohberg, Niederau (DE); Thomas Werner, Moritzburg (DE)

(73) Assignee: Advanced Micro Devices, Inc., Austin, TX (US)

( * ) Notice: Subject to any disclaimer, the term of this patent is extended or adjusted under 35 U.S.C. 154(b) by 545 days.

(21) Appl. No.: 12/131,332

(22) Filed: Jun. 2, 2008

(65) Prior Publication Data

US 2009/0140431 A1    Jun. 4, 2009

(30) Foreign Application Priority Data

Nov. 30, 2007  (DE) .......................... 10 2007 057 682

(51) Int. Cl.
*H01L 29/40*    (2006.01)
(52) U.S. Cl. . 257/758; 257/369; 257/411; 257/E29.156; 438/197; 438/199
(58) Field of Classification Search .................. 438/197, 438/217, 586, 199, 733; 257/347, 384, 411, 257/E29.064, 156, 258, 758, 369, E29.156, 257/E29.258
See application file for complete search history.

(56) References Cited

U.S. PATENT DOCUMENTS

| | | | | |
|---|---|---|---|---|
| 6,465,294 | B1 * | 10/2002 | Tsai et al. ...................... | 438/217 |
| 6,933,565 | B2 * | 8/2005 | Matsumoto et al. .......... | 257/347 |
| 7,012,028 | B2 * | 3/2006 | Bu et al. ........................ | 438/733 |
| 7,585,720 | B2 * | 9/2009 | Sudo ............................. | 438/199 |
| 2002/0068423 | A1 * | 6/2002 | Park et al. ..................... | 438/586 |
| 2002/0109196 | A1 * | 8/2002 | Fujisawa et al. .............. | 257/384 |
| 2007/0099360 | A1 * | 5/2007 | Lee et al. ...................... | 438/197 |
| 2007/0099414 | A1 | 5/2007 | Frohberg et al. .............. | 438/618 |
| 2007/0117372 | A1 | 5/2007 | Hsu et al. ...................... | 438/622 |
| 2007/0120262 | A1 | 5/2007 | Lee ............................... | 257/760 |
| 2008/0079087 | A1 * | 4/2008 | Nam et al. ..................... | 257/369 |
| 2008/0128834 | A1 * | 6/2008 | Yang et al. .................... | 257/411 |

FOREIGN PATENT DOCUMENTS

DE    10 2005 052 000 B3    7/2007

OTHER PUBLICATIONS

Translation of Official Communication from German Patent Office for German Patent Application No. 10 2007 057 682.1-33 dated Aug. 12, 2008.

\* cited by examiner

*Primary Examiner* — Kenneth Parker
*Assistant Examiner* — Fang-Xing Jiang
(74) *Attorney, Agent, or Firm* — Williams, Morgan & Amerson, P.C.

(57) ABSTRACT

By forming the first metallization layer of a semiconductor device as a dual damascene structure, the contact elements may be formed on the basis of a significantly reduced aspect ratio, thereby enhancing process robustness and also improving electrical performance of the contact structure.

24 Claims, 10 Drawing Sheets

HYBRID CONTACT STRUCTURE WITH LOW ASPECT RATIO CONTACTS IN A SEMICONDUCTOR DEVICE

BACKGROUND OF THE INVENTION

1. Field of the Invention

The present disclosure generally relates to the field of semiconductor manufacturing, and, more particularly, to the formation of an interconnect structure directly contacting a circuit element with the first metallization level.

2. Description of the Related Art

Semiconductor devices, such as advanced integrated circuits, typically contain a great number of circuit elements, such as transistors, capacitors, resistors and the like, which are usually formed in a substantially planar configuration on an appropriate substrate having formed thereon a crystalline semiconductor layer. Due to the large number of circuit elements and the required complex layout of modern integrated circuits, the electrical connections of the individual circuit elements may generally not be established within the same level on which the circuit elements are manufactured, but require one or more additional "wiring" layers, which are also referred to as metallization layers. These metallization layers generally include metal-containing lines, providing the inner-level electrical connection, and also include a plurality of inter-level connections, which are also referred to as "vias," that are filled with an appropriate metal and provide the electrical connection between two neighboring stacked metallization layers.

Due to the continuous reduction of the feature sizes of circuit elements in modern integrated circuits, the number of circuit elements for a given chip area, that is, the packing density, also increases, thereby requiring an even larger increase in the number of electrical connections to provide the desired circuit functionality, since the number of mutual connections between the circuit elements typically increases in an over-proportional way compared to the number of circuit elements. Therefore, the number of stacked metallization layers usually increases as the number of circuit elements per chip area becomes larger, while nevertheless the sizes of individual metal lines and vias are reduced. Due to the moderately high current densities that may be encountered during the operation of advanced integrated circuits, and owing to the reduced feature size of metal lines and vias, semiconductor manufacturers are increasingly replacing the well-known metallization materials, such as aluminum, with a metal that allows higher current densities and, hence, permits a reduction in the dimensions of the interconnections. Consequently, copper and alloys thereof are materials that are increasingly used in the fabrication of metallization layers due to the superior characteristics in view of resistance against electromigration and the significantly lower electrical resistivity compared to, for instance, aluminum. Despite these advantages, copper also exhibits a number of disadvantages regarding the processing and handling of copper in a semiconductor facility. For instance, copper readily diffuses in a plurality of well-established dielectric materials, such as silicon dioxide, wherein even minute amounts of copper, accumulating at sensitive device regions, such as contact regions of transistor elements, may lead to a failure of the respective device. For this reason, great efforts have to be made to reduce or avoid any copper contamination during the fabrication of the transistor elements, thereby rendering copper a less attractive candidate for the formation of contact plugs, which are in direct contact with respective contact regions of the circuit elements. The contact plugs provide the electrical contact of the individual circuit elements to the first metallization layer, which is formed above an interlayer dielectric material that encloses and passivates the circuit elements.

Consequently, in advanced semiconductor devices, the respective contact plugs are typically formed of a tungsten-based metal in an interlayer dielectric stack, typically comprised of silicon dioxide, that is formed above a corresponding bottom etch stop layer, which may typically be formed of silicon nitride. Due to the ongoing shrinkage of feature sizes, however, the respective contact plugs have to be formed within respective contact openings with an aspect ratio which may be as high as approximately 8:1 or more, wherein a diameter of the respective contact openings may be 0.1 μm or even less for transistor devices of the 65 nm technology. The aspect ratio of such openings is generally defined as the ratio of the depth of the opening to the width of the opening. Consequently, the resistance of the respective contact plugs may significantly restrict the overall operating speed of highly advanced integrated circuits, even though a highly conductive material, such as copper or copper alloys, may be used in the metallization layers. Moreover, sophisticated etch and deposition techniques may be required for forming the contact plugs, as will be described with reference to FIGS. 1*a* and 1*b* in more detail.

FIG. 1*a* schematically illustrates a top view of a portion of a semiconductor device 100. The semiconductor device 100 comprises a substrate (not shown in FIG. 1*a*) above which is formed a semiconductor layer (not shown) in and above which circuit elements, such as a transistor and the like, are formed. For convenience, a circuit element in the form of a transistor 150 is illustrated. The transistor 150 may comprise a gate electrode structure 151, sidewalls of which may be covered by a spacer element 152. Laterally adjacent to the gate electrode structure 151, an active region in the form of drain and source regions 153 are provided which may be, in addition to a channel region (not shown), located below the gate electrode structure 151 and may represent an active region in the corresponding semiconductor layer. The active region may be defined by an isolation structure 102, above which a portion of the gate electrode structure 151 may be positioned, thereby defining a contact region 154 in contact with a contact plug or contact element 110. Similarly, one or more contact elements 111 may be provided in the drain or source region 153, wherein, for convenience, only one such contact element 111 is illustrated. It should be appreciated that the contact elements 110, 111 are typically formed in an appropriate interlayer dielectric material which, for convenience, is not shown in FIG. 1*a*.

FIG. 1*b* schematically illustrates a cross-sectional view along the line 1*b* as shown in FIG. 1*a*, wherein the semiconductor device 100 is illustrated in a further advanced manufacturing stage. As shown, the semiconductor device 100 comprises a substrate 101 which represents any appropriate carrier material, such as a silicon substrate, a silicon-on-insulator (SOI) substrate and the like. A silicon-based semiconductor layer 103 is formed above the substrate 101, and the isolation structure 102, for instance, in the form of a trench isolation, defines an active region 104 in which are positioned the drain and source regions 153, i.e., respective dopant concentrations, to define respective PN junctions with the remaining portion of the active region 104. Furthermore, metal silicide regions 155 may be formed in the drain and source regions 153, thereby defining a contact region thereof, and on the gate electrode structure 151, including the contact portion 154, thereby also defining a respective contact region for the gate electrode structure 151. Furthermore, the semiconductor device comprises an interlayer dielectric material 115 which typically comprises two or more dielectric layers, such as the layers 115A, which may represent a contact etch stop layer comprised of silicon nitride, and a second dielectric material 115B, for instance, provided in the form of a silicon dioxide material. Typically, a thickness 115T of the interlayer dielectric material 115 is in the range of several hundred nanometers so as to obtain a sufficient distance between the gate electrode structure 151 and a first metallization layer 120 in order to maintain the parasitic capacitance at a required low level. Consequently, the contact element 111 connecting to the drain or source region 153 may have a moderately high aspect ratio, since the lateral size thereof is substantially restricted by the lateral dimension of the drain and source regions 153, while the depth of the contact element 111 is determined by the thickness 115T of the interlayer dielectric material 115. On the other hand, the contact element 110 only has to extend down to the top surface of the gate electrode structure 151, i.e., to the contact portion 154, while also the lateral dimension of the contact element 110 may be different compared to the element 111, depending on the size and shape of the contact portion 154. The contact elements 110, 111 typically comprise a barrier material in the form of a titanium liner 112, followed by a titanium nitride liner 113, while the actual fill material 114 may be provided in the form of a tungsten material.

The metallization layer 120 typically comprises an etch stop layer 123, for instance, in the form of silicon nitride, silicon carbide, nitrogen-enriched silicon carbide and the like, on which may be formed an appropriate dielectric material, such as a low-k dielectric material having a relative permittivity of 3.0 or less. Moreover, respective metal lines 121, 122 are formed in the dielectric material 124 and connect to the contact elements 110, 111, respectively. The metal lines 121, 122 may comprise a copper-containing metal in combination with an appropriate barrier material 125, such as a material comprising tantalum, tantalum nitride and the like. Finally, a cap layer 126 is typically provided to confine the copper material in the metal lines 121, 122, which may be accomplished on the basis of dielectric materials such as silicon nitride, silicon carbide and the like.

A typical process flow for forming the semiconductor device 100 as shown in FIG. 1b may comprise the following processes. After forming the circuit element 150 on the basis of well-established techniques in accordance with design rules of the respective technology node, which includes forming an appropriate gate insulation layer (not shown) and patterning the same along with the gate electrode structure 151 by sophisticated lithography and etch techniques, the drain and source regions 153 may be formed by ion implantation, using the spacer structure 152 as an appropriate implantation mask. After any anneal cycles, the metal silicide regions 155 are formed and the interlayer dielectric material is deposited, for instance, by forming the contact etch stop layer 115A, followed by the deposition of silicon dioxide material on the basis of plasma enhanced chemical vapor deposition (PECVD) techniques. After planarizing the resulting surface topography of the silicon dioxide material, a photolithography sequence may be performed on the basis of well-established recipes, followed by anisotropic etch techniques for forming contact openings extending through the interlayer dielectric material 115 so as to connect to the gate electrode structure 151 and the drain and source regions 153. During the respective etch process, sophisticated patterning regimes may be required due to the high aspect ratio of the corresponding contact opening, in particular for the contact element 111. During the complex etch sequence, the layer 115A may be used as an etch stop layer for etching the silicon dioxide material 115B, after which a further etch process may be performed in order to finally expose the contact regions in the drain and source regions 153 and the gate electrode structure 151, i.e., the metal silicide regions 155. Next, the titanium nitride liner 112 is formed on the basis of, for instance, physical vapor deposition, such as sputter deposition. The term "sputtering" describes a mechanism in which atoms are ejected from a surface of a target material that is itself hit by sufficiently energetic particles. Sputtering has become a frequently used technique for depositing titanium, titanium nitride and the like. Due to the superior characteristics compared to, for instance, CVD techniques with respect to controlling layer thickness, when forming compounds such as titanium nitride and the like, additionally, exposed surfaces may be inherently cleaned by performing a sputtering without providing a deposition species. Thus, after forming the titanium nitride liner 112, the titanium layer 113 may also be formed by sputter deposition wherein, however, the high aspect ratio, in particular in the contact opening corresponding to the contact element 111, may result in an increased layer thickness at sidewall portions so as to accomplish a reliable coverage of all exposed surface portions of the contact opening. Thereafter, the tungsten material 114 may be deposited by chemical vapor deposition (CVD) in which tungsten hexafluorine ($WF_6$) is reduced in a thermally activated first step on the basis of silane and is then converted into tungsten in a second step on the basis of hydrogen. During the reduction of the tungsten on the basis of hydrogen, a direct contact to silicon dioxide of the layer 115B is substantially prevented by the titanium liner 113 in order to avoid undue silicon consumption from the silicon dioxide. On the other hand, the silicon nitride layer 112 may enhance the adhesion of the titanium liner 113, thereby enhancing the overall mechanical stability of the contact elements 110, 111. Thus, the increased aspect ratio of the contact element 111 may result in a highly complex etch sequence and a subsequent deposition of the liners 112, 113 which may result in a reduced effective cross-sectional area of the contact element 111, thereby increasing the overall series resistance thereof. On the other hand, any non-uniformities during the complex patterning process may result in a contact failure, which may represent one of the dominant factors that contribute to the overall yield loss.

Thereafter, the metallization layer 120 may be formed by depositing the etch stop layer 123 followed by the deposition of the dielectric material 124. Next, respective trenches are formed in the dielectric material 124 according to well-established single damascene strategies. Next, metal lines 121, 122 may be formed by depositing a barrier layer 125 and filling in a copper-based material, for instance, on the basis of electroplating, which may be preceded by the deposition of a copper seed layer. Finally, any excess material may be removed, for instance by chemical mechanical polishing (CMP), and the cap layer 126 may be deposited.

Consequently, the contact structure of the semiconductor device 100 comprises high aspect ratio contacts, such as the contact element 111, resulting in a complex patterning and deposition regime, thereby increasing the probability for reduced production yield, while also contributing to increased resistance and thus reduced electrical performance.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to methods and semiconductor devices formed by these methods, wherein an enhanced contact structure may be provided in which a reduced aspect ratio of the corresponding contact openings may significantly relax any constraints posed on the respective manufacturing sequence. This is accomplished by providing the very first metallization layer as a dual damascene structure in which respective copper-based vias may connect to contact elements formed in a dielectric material having a significantly reduced thickness compared to conventional interlayer dielectric materials. Thus, the contact elements may be formed with increased process robustness due to the reduced aspect ratio, while the copper-based vias provide enhanced electrical and thermal performance. Furthermore, the dielectric material of the first metallization layer may be provided in the form of a low-k dielectric material having a permittivity of 3.0 and less, thereby enabling the reduction of the distance between the gate electrode structures and metal lines of the first metallization layer or reducing the parasitic capacitance for a similar distance compared to conventional devices.

One illustrative method disclosed herein comprises forming a first dielectric layer at least laterally adjacent to a circuit element, which is partially formed above a semiconductor region that has a contact region. The method further comprises forming a contact element in the first dielectric layer to connect to the contact region. Additionally, the method comprises forming a second dielectric layer above the first dielectric layer, wherein the second dielectric layer comprises a low-k dielectric material. Furthermore, the second dielectric layer is patterned to contain a via opening connecting to the contact element to contain a trench connecting to the via opening. Finally, the via opening and the trench are filled in a common deposition process sequence.

Another illustrative method for forming a contact structure of a semiconductor device is disclosed herein. The method comprises forming a low-k dielectric layer of the first metallization layer above a circuit element that is embedded in a dielectric material, which comprises a contact element connecting to a contact region of the circuit element. The method further comprises patterning the low-k dielectric layer to receive a via opening that connects to the contact element and to receive a trench that connects to the via opening. Finally, the via opening and the trench are filled with a metal-containing material in a common fill process.

One illustrative semiconductor device disclosed herein comprises a conductive line that partially extends above an active region of the semiconductor device. Furthermore, a first contact region formed on the active region is provided and a second contact region is formed on a top surface of the conductive line. A dielectric material at least laterally encloses the conductive line and a first contact element is formed in the dielectric material and connects to the first contact region, wherein the first contact element has an aspect ratio of 5 or less and comprises a first metal. Finally, the semiconductor device comprises a first metallization layer comprising a low-k dielectric material and a metal line and a via wherein the via connects to the first contact element and comprises a second metal other than the first metal.

BRIEF DESCRIPTION OF THE DRAWINGS

The disclosure may be understood by reference to the following description taken in conjunction with the accompanying drawings, in which like reference numerals identify like elements, and in which.

Figure 1A:
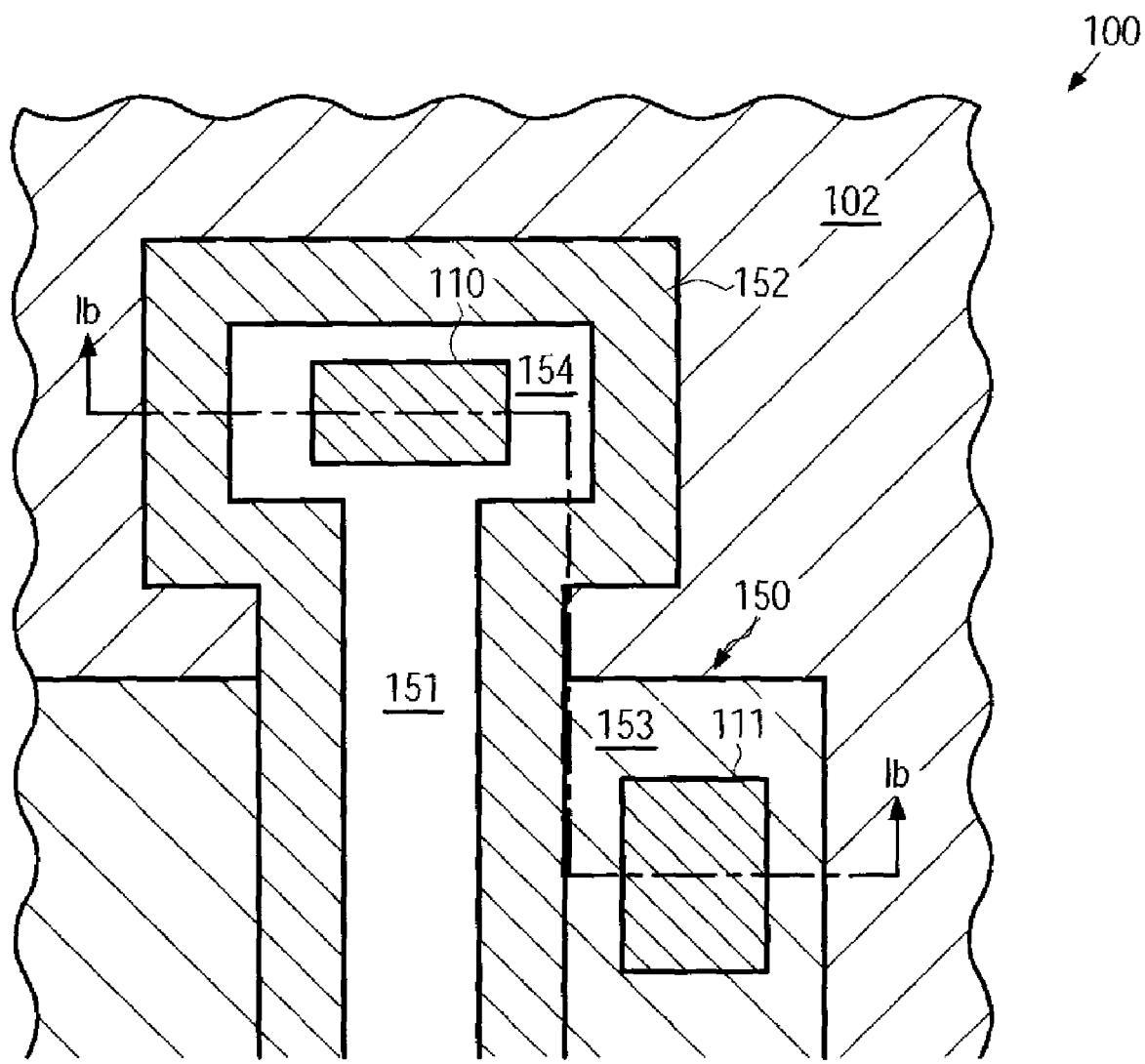
FIG. 1a schematically illustrates a top view of a conventional semiconductor device comprising contact plugs connecting to a gate electrode structure and a drain or source region, according to conventional techniques.
Figure 1B:
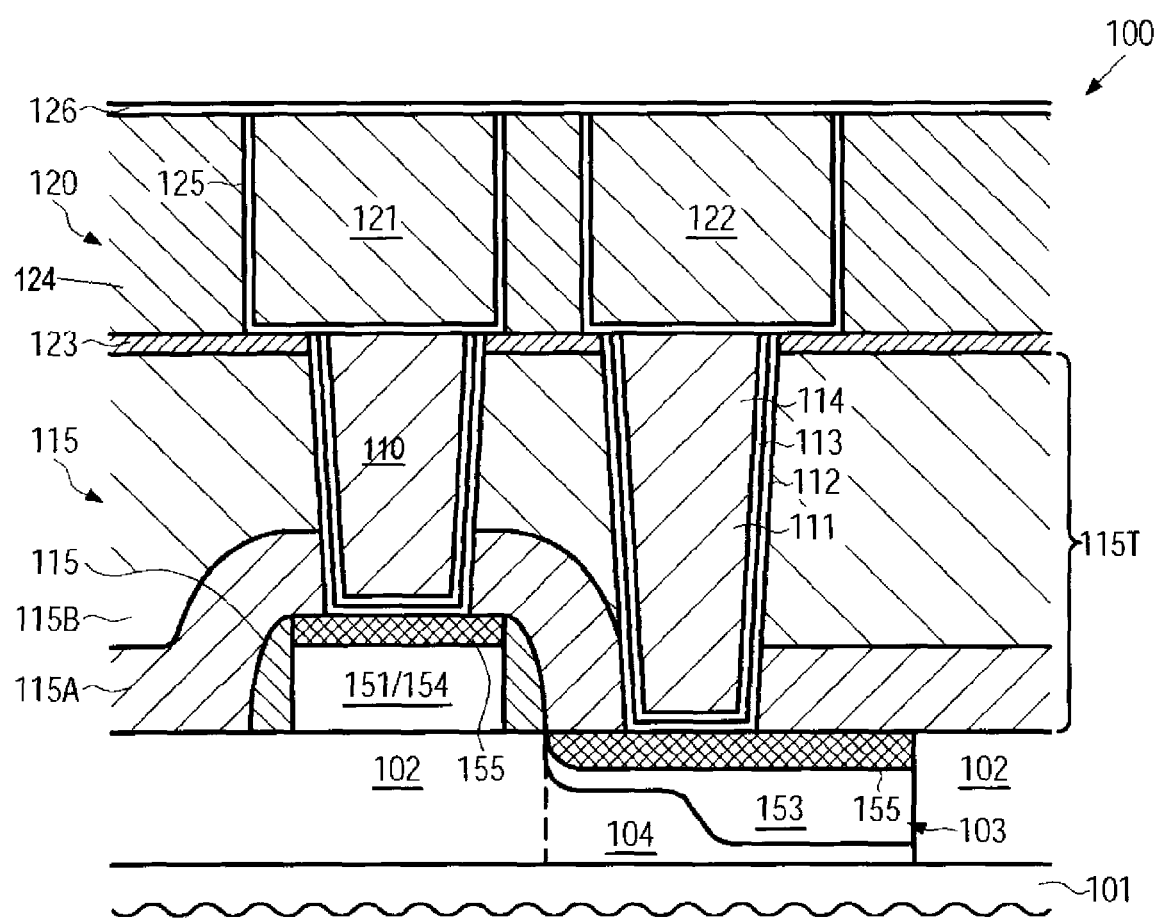
FIG. 1b schematically illustrates a cross-sectional view along the line 1b of the device of FIG. 1a in a further advanced manufacturing stage with high aspect ratio contact plugs, according to conventional approaches.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the principles disclosed herein relate to techniques for forming enhanced contact structures in sophisticated semiconductor devices, wherein an aspect ratio of contact elements may be defined on the basis of well-established metal materials, such as tungsten, and may be reduced, while at the same time the first metallization layer may be formed so as to comprise metal lines and vias, which may connect to the contact elements of reduced aspect ratio. Thus, for a given height distance between circuit elements, such as gate electrodes and the very first metallization level, i.e., the metal lines formed therein, enhanced electrical performance may be accomplished by a reduced series resistance of the conductive path connections to the contact areas of the circuit element, since the vias may be provided on the basis of a highly conductive metal, such as copper. Furthermore, the vias of the first metallization layer may be embedded into a low-k dielectric material which may further reduce the parasitic capacitance between gate electrode structures and the metal lines of the first metallization layer. Additionally, the overall process robustness may be increased since the patterning of the contact element may be accomplished on the basis of a significantly reduced thickness of the dielectric material. Also, the metal lines and vias may be formed in a common process sequence, i.e., a dual damascene strategy, thereby enhancing the overall process efficiency. In other cases, the combined height of the contact structure and the via portion of the first metallization layer may be reduced compared to conventional devices of the same technology standard due to the overall reduced permittivity resulting from the low-k dielectric material of the first metallization layer, thereby further enhancing process robustness and reducing the series resistance of the conductive path from the circuit elements to the metal lines of the first metallization layer.

In some illustrative aspects disclosed herein, contact elements connecting to gate electrode structures may be omitted and may be efficiently replaced by respective vias of the first metallization level, thereby even further reducing the aspect ratio of contact elements connecting to active regions, for instance, drain and source regions of transistor elements. In still other aspects, material of the gate electrode structure may be replaced by a metal-containing material of enhanced conductivity prior to forming respective contact elements, thereby further reducing the aspect ratio of the contact elements. In other cases, a stress-inducing dielectric material may be provided with high reliability, irrespective of the initially defined surface topography, while at the same time providing reduced aspect ratio contact elements.

Figure 2A:
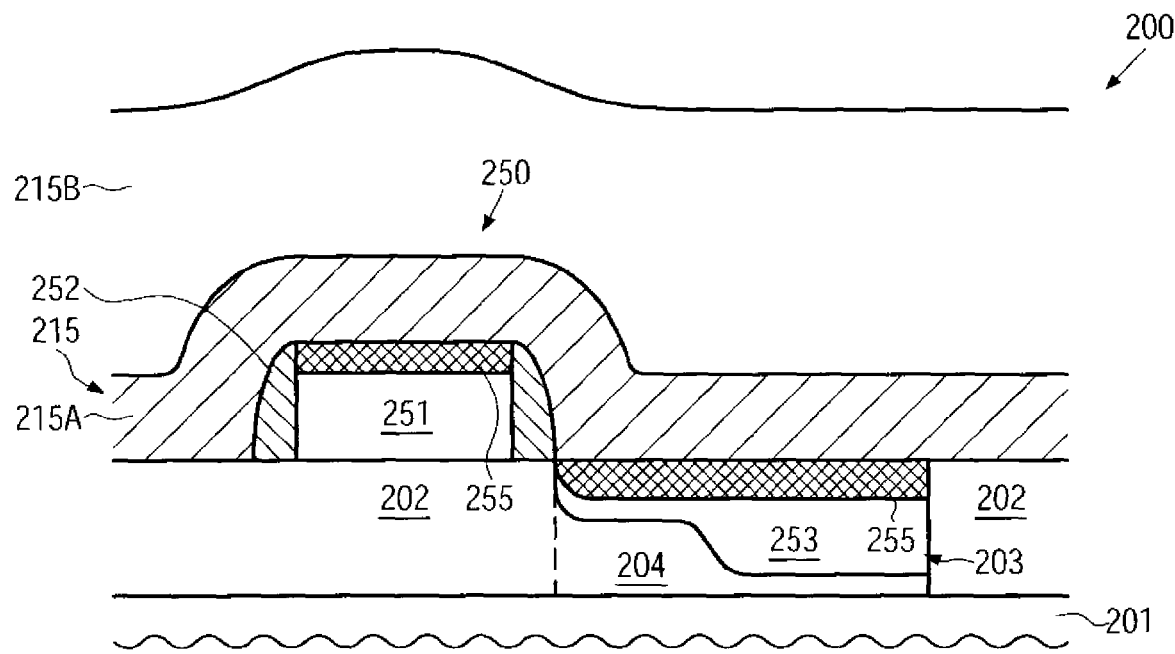
FIGS. 2a-2h schematically illustrate cross-sectional views of a semiconductor device during various manufacturing stages in forming contact elements with reduced aspect ratio in combination with a first metallization layer having vias and metal lines including a highly conductive metal and a low-k dielectric material, according to illustrative embodiments.

FIG. 2a schematically illustrates a cross-sectional view of a semiconductor device 200 which may have a similar configuration as the semiconductor device 100 as shown in FIG. 1a. That is, the cross-sectional view may illustrate device areas which are offset with respect to a direction perpendicular to the drawing plane of FIG. 2a. Thus, the device 200 may comprise a substrate 201 having formed thereabove a semiconductor layer 203, for instance, in the form of a silicon-based material or any other appropriate semiconductor material used for forming therein and thereabove circuit elements, such as transistors, capacitors and the like. As previously explained with reference to the device 100, the substrate 201 and the semiconductor layer 203 may define a bulk configuration in which the semiconductor layer 203 may represent an upper portion of the substrate 201, while, in other cases, an SOI configuration may be defined by providing a buried insulating layer (not shown), wherein both a bulk configuration and an SOI configuration may be realized in the device 200 in different device areas according to further illustrative embodiments. In the semiconductor layer 203, an isolation structure 202 may delineate an active region 204, in which an appropriate dopant profile, for instance, in the form of a drain or source region 253 may be defined. Furthermore, in the manufacturing stage shown, a metal silicide region 255 may be formed when a significant amount of silicon may be contained in the active region 204. For example, the active region 204 may represent a portion of a channel region and a drain or source region of a transistor element. Moreover, the device 200 may comprise a circuit element 251 which may represent a gate electrode structure of a transistor, which may be referred to as transistor 250, while, in other cases, the conductive line 251 may represent an interconnect line used for connecting respective circuit elements, such as transistors and the like, within the same device level. As shown, the conductive line 251, which may be comprised of polysilicon or any other appropriate conductive material, may have formed on sidewalls thereof a spacer structure 252. Furthermore, when comprised of a silicon-containing material, a metal silicide region 255 may be formed thereon. It should be appreciated that the conductive line 251 may not necessarily represent a conductive material at this manufacturing stage but may be replaced by a conductive material, partially or completely, at a later manufacturing stage, as will be described later on in more detail.

The semiconductor device 200 may further comprise a dielectric material 215 which may be comprised of well-established conventional dielectrics, i.e., dielectric materials having relative permittivity of approximately 3.5-7.0, depending on the material composition. For example, the dielectric material 215 may comprise a first sub-layer 215A in the form of a silicon nitride material, a nitrogen-containing silicon carbide material and the like. In some illustrative embodiments, the first sub-layer 215A may be provided as a stress-inducing layer, which may comprise compressive or tensile stress, depending on whether the charge carrier mobility in the active region 204 may be enhanced by tensile or compressive stress. As is well known, a certain type of strain in a crystalline semiconductor material may significantly change the charge carrier mobility therein. For example, in silicon-based semiconductor devices, a certain amount of strain may significantly modify the charge carrier mobility and thus the drive current capability of respective devices. It should be appreciated that the sub-layer 215A may comprise different portions having different internal stress, depending on the configuration of respective circuit elements, for instance transistors, wherein some transistors may require a high compressive stress while other transistors may require a high tensile stress. For example, silicon nitride, nitrogen-containing silicon carbide and the like may be provided with high internal compressive stress with an internal stress level of 2 GPa and even higher. On the other hand, silicon nitride may be deposited with high tensile stress in the range of approximately 1 GPa and significantly higher. It should be appreciated that, depending on the overall surface geometry of the device 200, the thickness of the sub-layer 215A may have to be selected in correspondence with any gap fill capabilities of the deposition process under consideration to obtain a deposition behavior as required for completely filling any spaces between neighboring circuit elements, such as the conductive lines 251, which may be provided with only a small distance of several hundred nanometers and even less in dense device areas.

Furthermore, the dielectric material 215 may comprise one or more additional sub-layers 215B, for instance, in the form of silicon dioxide, for which deposition techniques of enhanced gap fill capabilities may be available according to well-established recipes. In this case, well-established techniques may be used for forming the sub-layers 215A, 215B, wherein, however, contrary to conventional strategies, the material 215 may not be provided with a respective thickness compared to a conventional interlayer dielectric material, but may be deposited to enable a subsequent planarization of the surface topography, for instance, on the basis of the layer 215A, or to provide a planar surface at any desired height that may be less than the height of the conductive line 251, as will be described later on in more detail.

The semiconductor device 200 may be formed on the basis of the same process techniques as previously described with reference to the device 100, except for a reduced overall thickness for the dielectric materials 215, wherein appropriate stress liner techniques may also be used if enhanced stress in the active region 204 may be desired.

Figure 2B:
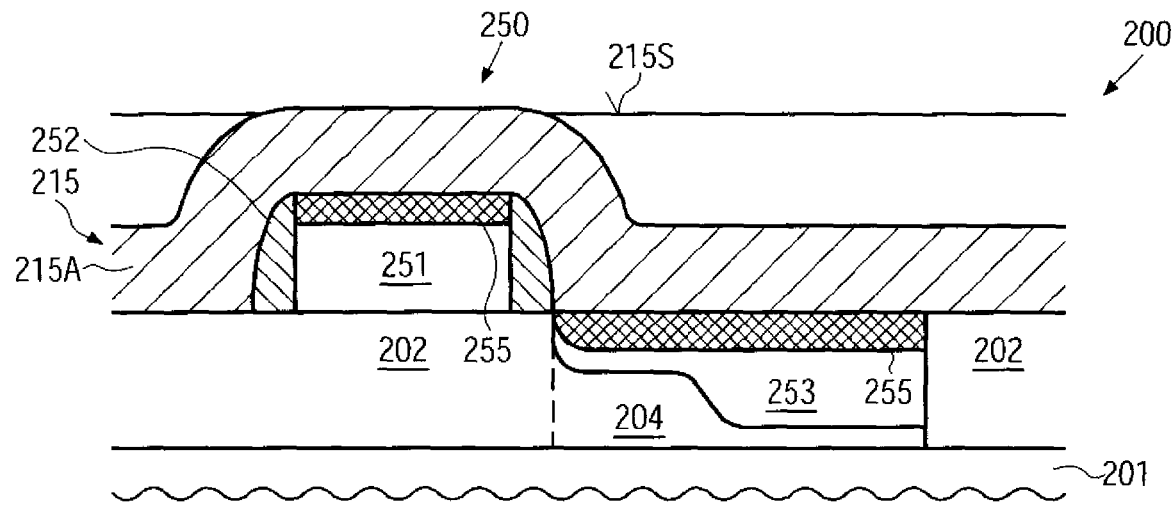

FIG. 2b schematically illustrates the semiconductor device 200 with a substantially planarized surface topography 215S, which may be obtained by performing an appropriate planarization process such as a chemical mechanical polishing (CMP) process, an appropriate etch process or any combination thereof. For example, a selective CMP recipe may be used, thereby removing the material of the sub-layer 215B with increased removal rate compared to material of the sub-layer 215A, which may therefore act as an efficient CMP stop layer. For instance, respective selective CMP recipes are well established for silicon dioxide and silicon nitride.

Figure 2C:
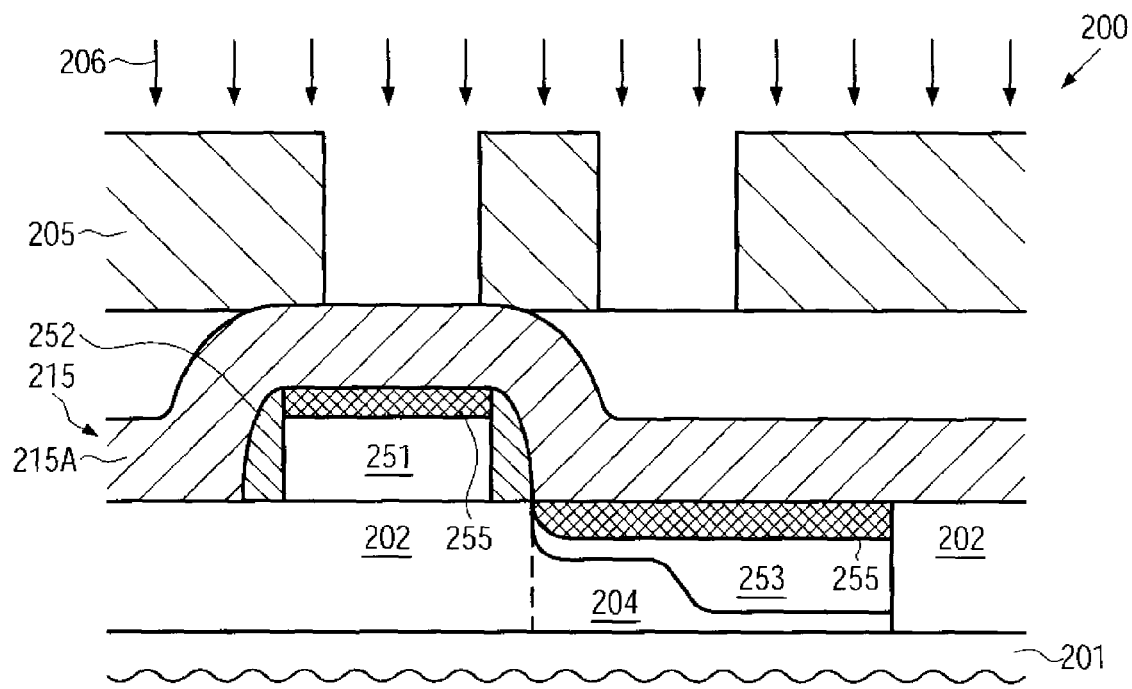

FIG. 2c schematically illustrates the semiconductor device 200 with an etch mask 205 formed on the planarized surface 215S on the basis of well-established lithography techniques. It should be appreciated that the etch mask 205 may be formed on the basis of less constrained conditions, since the subsequent patterning process may only have to etch through a significantly reduced layer thickness that is comparable to the height of the conductive line 251 and the thickness of the sub-layer 215A, while, in other illustrative embodiments, a reduced height may be created prior to actually patterning respective openings for contact elements, as will be described later on. On the basis of the etch mask 205, an anisotropic etch process 206 may be performed, for instance, using well-established etch recipes as may be used for opening silicon nitride-based contact etch stop layers, as previously explained with reference to the device 100, wherein a first etch step may be used to etch through the planarized portion of the second sub-layer 215B. In other cases, a substantially non-selective etch chemistry may be used to commonly etch through the layers 215B, 215A, wherein the metal silicide regions or contact regions 255 may act as an efficient etch stop.

Figure 2D:
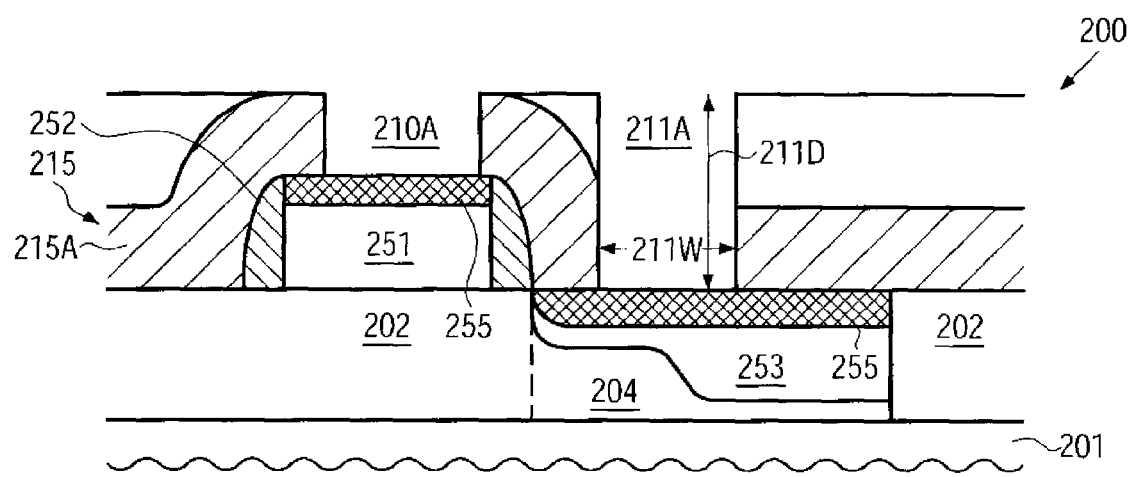

FIG. 2d schematically illustrates the semiconductor device 200 after the etch process 206 and after the removal of the etch mask 205. Hence, a first contact opening 211A may be formed within the planarized dielectric material 215 to connect to the active region 204 by the metal silicide region 255, which may thus be understood as a contact region for the active region 204. A depth 211D of the opening 211A may be substantially defined by the thickness of the planarized dielectric material 215, that is, for the embodiment shown, by the height of the conductive line 251 and approximately by the thickness of the first sub-layer 215A. On the other hand, a width 211W, i.e. a lateral dimension of the opening 211A, may be defined by design rules of the technology standard under consideration and which may be comparable to the width of the contact 111 in the device 100, if the same technology standard is used. Thus, an aspect ratio of the opening 211A defined by the ratio of the depth 211D and the width 211W may be significantly lower compared to the aspect ratio defined by the conventional contact element 111, and may be 5 or less, or even 3 or less, depending on the device requirements. Similarly, a contact opening 210A is formed above a conductive line 251 and has a lateral dimension as required by the design rule, wherein a depth is substantially determined by a thickness of the sub-layer 215A.

Figure 2E:
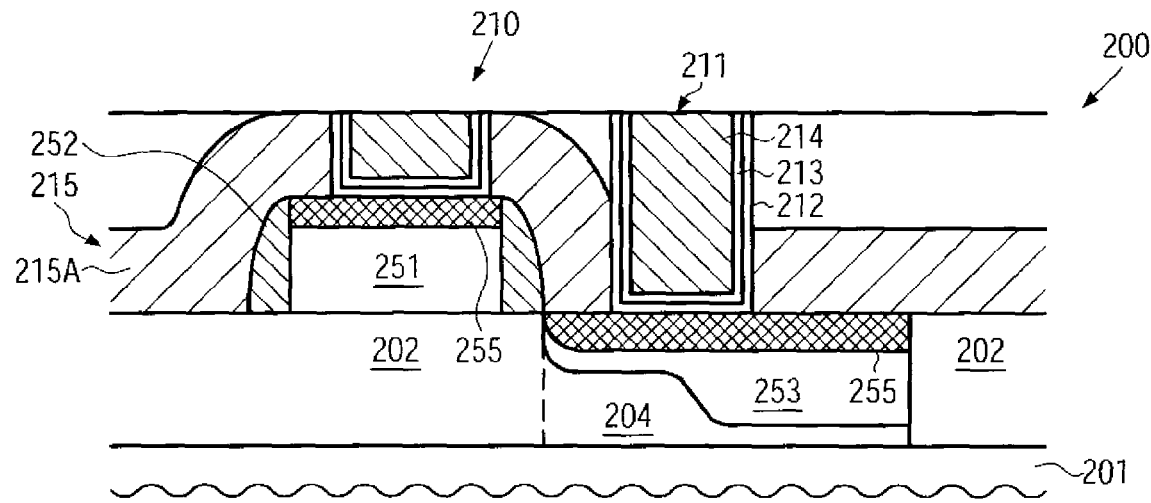

FIG. 2e schematically illustrates the semiconductor device 200 in a further advanced manufacturing stage. As shown, a contact element 211 may be formed in the opening 211A and a respective contact element 210 may be formed in the opening 210A. The contact elements may comprise a titanium nitride liner 212, followed by a titanium layer 213 and a tungsten-based fill material 214. As previously explained, a moderately complex deposition sequence may be required for forming the layers 212, 213 and finally filling the structure with the tungsten material 214. Due to the significantly reduced aspect ratio of the openings 211A, 210A, the barrier materials 212 and 213 may be provided with reduced thickness and/or with increased reliability, thereby also enhancing the overall process robustness.

Figure 2F:
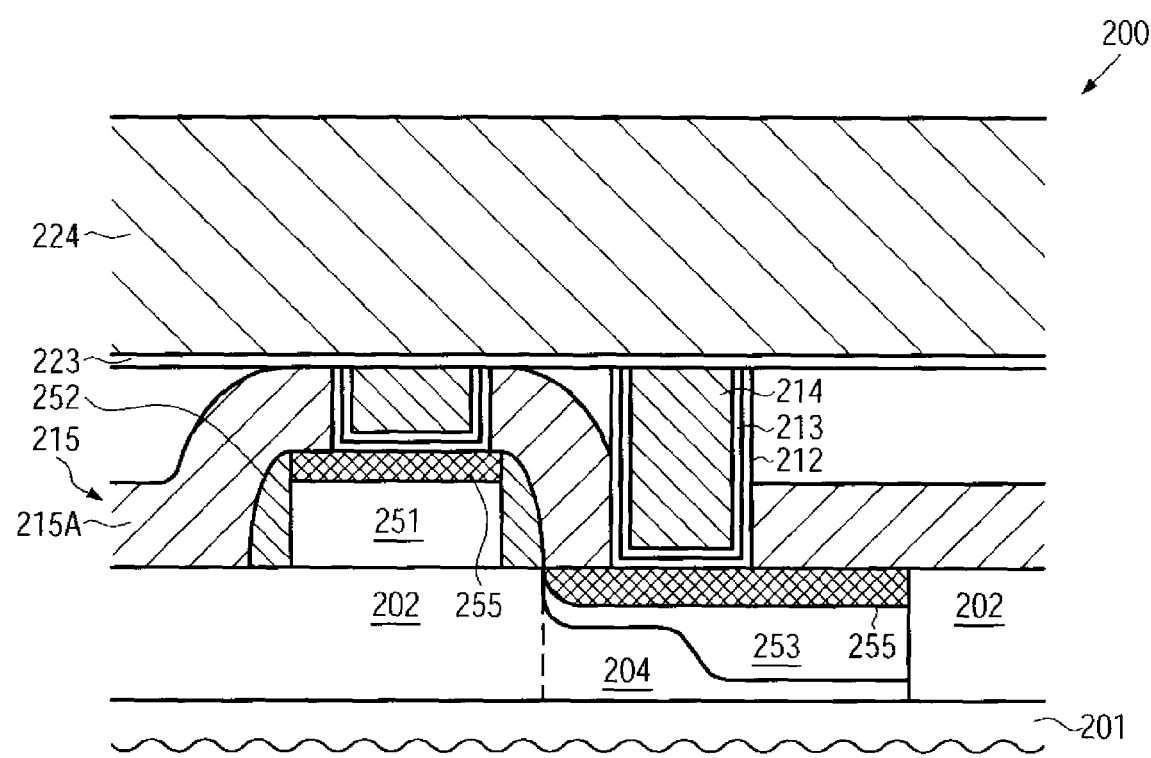

FIG. 2f schematically illustrates the semiconductor device 200 in a further advanced manufacturing stage, i.e., after removing any excess material of the liners 212, 213 and the fill material 214, for instance on the basis of CMP, and with a dielectric layer 224, which may be formed on an optional etch stop layer 223. The dielectric layer 224 may comprise a low-k dielectric material, i.e., a material having a relative permittivity of 3.0 or less, and may represent the dielectric material of the first metallization level to be formed above the contact structure comprised of the dielectric material 215 and the contact elements 210, 211. In some illustrative embodiments, a thickness of the dielectric layer 224 may be selectable so as to obtain a desired depth of respective metal lines and to provide a reduced parasitic capacitance between the conductive line 251 and any metal lines to be formed in the material 224. Due to incorporation of a low-k dielectric material, metal lines may be effectively positioned more closely to conductive lines 251 without contributing to increased capacitance or even providing a reduced capacitance compared to a conventional device corresponding to the same technology, while, in other cases, a substantially identical distance may be provided by appropriately selecting the thickness of the layer 224, thereby reducing the capacitance while also reducing the overall series resistance between the circuit elements and respective metal lines still to be formed in the dielectric material 224. The dielectric material 224 and the etch stop layer 223, if required, may be formed on the basis of well-established recipes.

Figure 2G:
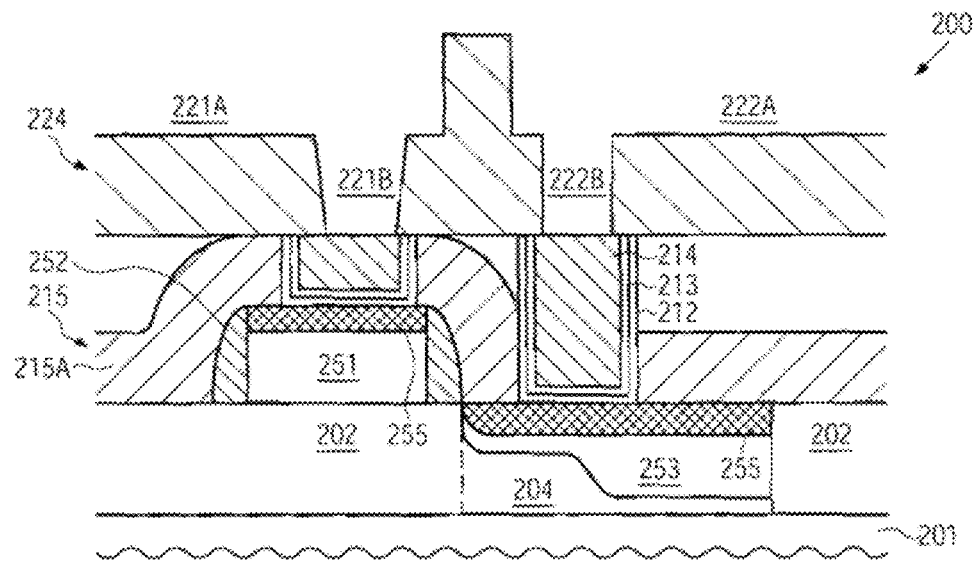
Figure 2H:
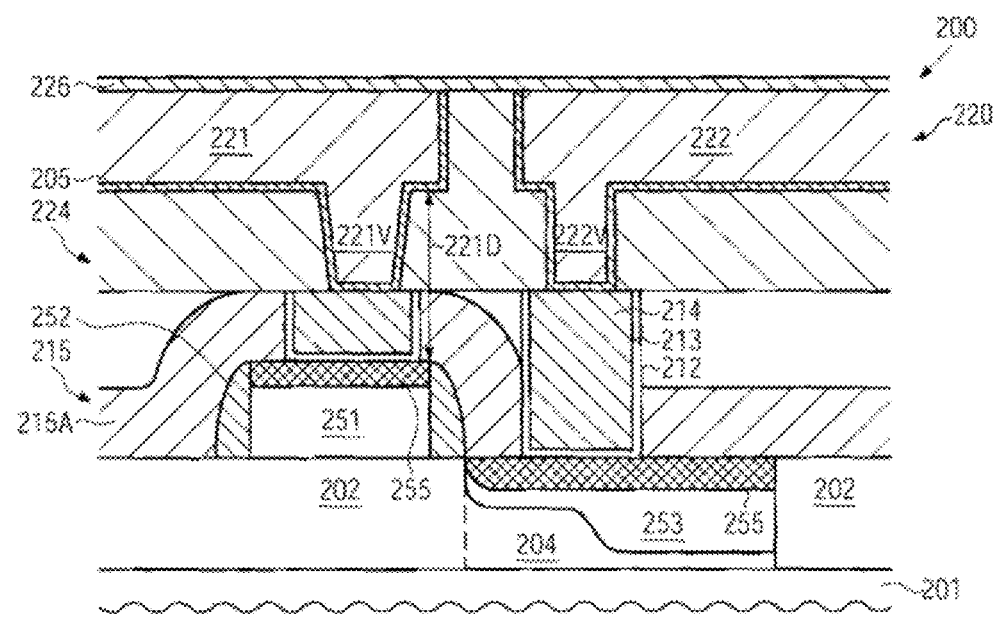

FIG. 2g schematically illustrates the semiconductor device 200 in a further advanced manufacturing stage. In the stage shown, the dielectric layer 224 may be patterned to contain a first trench 221A formed around a first via opening 221B, which in turn connects to the contact element 210. Similarly, a second trench 222A may be formed around a second via opening 222B, which connects to the contact element 211. The trenches and via openings may be formed in the dielectric material 224 on the basis of any well-established dual damascene strategies, i.e., first the via openings 221B, 222B may be formed on the basis of lithography and anisotropic etch techniques and thereafter the trenches 221A, 222A may be patterned. In other cases, the trenches 221A, 222A may be formed first and thereafter the via openings 221B, 222B may be formed on the basis of appropriate lithography and etch techniques. In the embodiment shown, the etch stop layer may have been omitted, while, in other cases, respective etch processes for patterning the via opening 221B, 222B may be controlled on the basis of the etch stop layer 223. Zone Name: a1,AMD FIG. 2h schematically illustrates the semiconductor device 200 in a further advanced manufacturing stage. As illustrated, a metal line 221 and a via 221V may be formed in the trench and via openings 221A, 221B to define a metallization layer 220 in conjunction with the dielectric layer 224. Similarly, a metal line 222 in combination with a via 222V may be formed in the openings 222A, 222B. The metal lines and via may comprise a conductive barrier material 205, for instance, in the form of tantalum, tantalum nitride, a combination thereof or any other appropriate material. Furthermore, a cap layer or etch stop layer 226, for example comprised of silicon nitride, silicon carbide, nitrogen-containing silicon carbide, a composition thereof and the like, may be provided to confine the metal regions and/or act as an etch stop layer for the formation of subsequent metallization levels.

The device 200 as shown in FIG. 2h may be formed by depositing the conductive barrier layer 205 which may thus continuously extend along the metal lines and also extend into the via, since the deposition of the barrier material 205 may be accomplished in a common deposition sequence, for instance using sputter techniques, atomic layer deposition (ALD), CVD, electrochemical deposition or any combination thereof. Thereafter, the actual fill material, such as a copper-based material, may be filled in, wherein, during the common deposition sequence, for instance, as an electroless plating process and/or an electroplating process, the vias are filled from bottom to top while also filling the trenches 221A, 222A. Thereafter, any excess material may be removed by, for instance, electrochemical etching, CMP and the like, and the cap layer 226 may be formed on the basis of well-established deposition techniques.

Consequently, the semiconductor device 200 as shown in FIG. 2h may be formed on the basis of reliable and robust process techniques due to the reduced aspect ratio of the contact elements 210, 211, while nevertheless providing a reduced series resistance due to the provision of the vias 221A, 222V including a metal with superior conductivity. Furthermore, for a desired distance 221D of the metal lines 221, 222 from the conductive line 251, which may represent gate electrode structures of respective transistor elements, a reduced parasitic capacitance may be accomplished, since the vias 221V, 222V which replace a portion of conventional contact elements may be embedded in a low-k dielectric material. Thus, increased process robustness may result in improved production yield, while the lower resistance and the reduced capacitance may result in a speed improvement. Furthermore, in some aspects, for a given parasitic capacitance, the distance 221D may be reduced compared to conventional devices due to the provision of the low-k dielectric material. This may be accomplished by reducing the height of the contact element 210, 211 and/or the heights of the vias 221V, 222V.

With reference to FIGS. 3a-3j, further illustrative embodiments will now be described in which the aspect ratio of the respective contact elements may further be reduced and/or the conductivity of conductive lines, such as gate electrodes, may be increased and/or an enhanced stress-inducing mechanism may be provided.

Figure 3A:
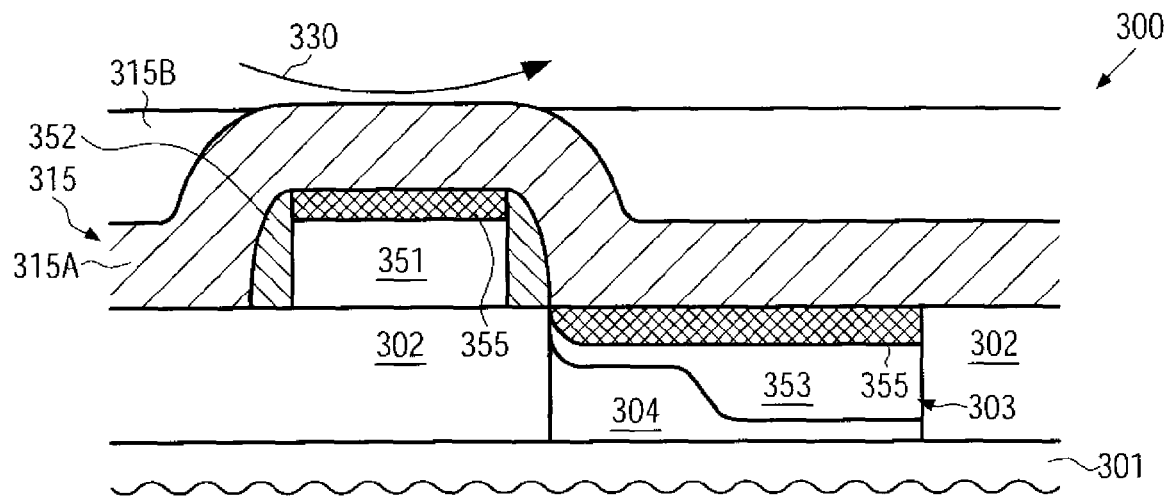
FIGS. 3a-3g schematically illustrate cross-sectional views of a semiconductor device during various manufacturing stages for forming low aspect ratio contact elements with an even further reduced aspect ratio, according to illustrative embodiments.

FIG. 3a schematically illustrates a semiconductor device 300 which may have substantially the same configuration as the device 200 as shown in FIG. 2b. Hence, the respective components may be denoted with the same reference signs, except for the first digit "3" that replaces the first digit "2." Any further detailed description of these components and any processes for forming the same will be omitted here.

The dielectric material 315, which may comprise the sub-layers 315A, 315B, may have been subjected to a respective planarization process, which may have been stopped upon exposing the sub-layer 315A. In other cases, a planarization process 330 may have been performed with substantially no selectivity and may be continued to remove material of the layers 315A, 315B. Thus, at least after exposing the layer 315A above the conductive line 351, the process 330 may be continued with substantially no selectivity between the layers 315A, 315B.

Figure 3B:
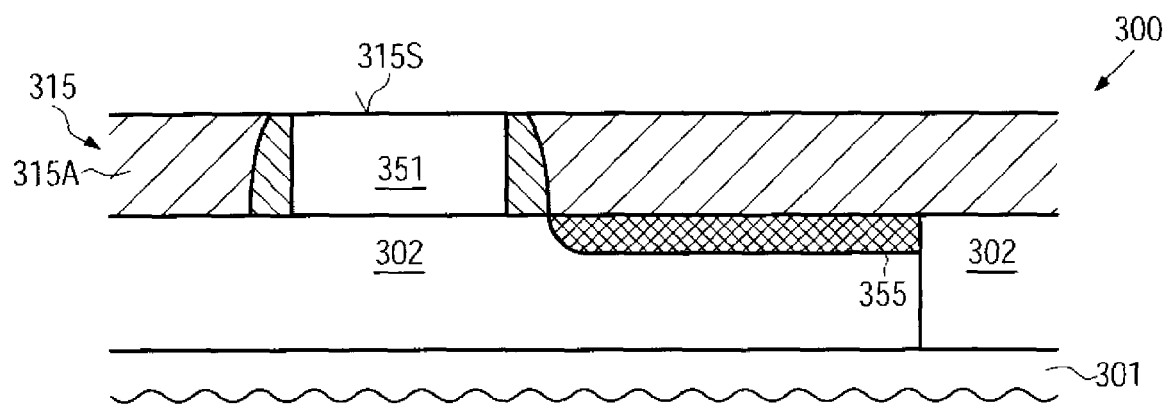

FIG. 3b schematically illustrates the semiconductor device 300 after finishing the process 330, thereby obtaining a respective substantially planar surface topography 315S, which exposes a top surface of the conductive line 351 to thereby substantially maintain the metal silicide region 355 therein in some embodiments (not shown), while, in other illustrative embodiments, a portion of the conductive line 351, possibly including all of the metal silicide region 355, may be removed. As previously explained, the thickness of the sub-layer 315A may not necessarily be sufficient to generate a height level that is equal to or higher than the height level of the conductive line 351 due to restricted gap filling capabilities of the respective deposition process in densely packed device regions. Thus, in the embodiment shown, the removal process 330 may be continued to provide the surface 315S without portions of the sub-layer 315B, thereby enhancing process uniformity during the subsequent processing.

Figure 3C:
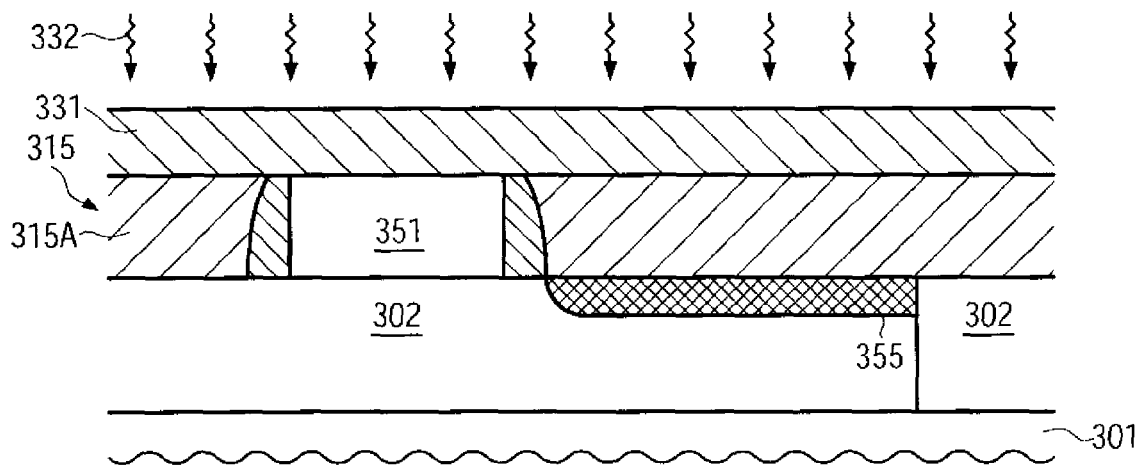

FIG. 3c schematically illustrates the semiconductor device 300 in a further advanced manufacturing stage in which a refractory metal 331, for instance in the form of nickel, platinum and the like, may be provided with an appropriate thickness to convert a required portion of the conductive line 351 into a highly conductive metal silicide. For this purpose, an appropriate heat treatment 332 may be performed, for instance, on the basis of appropriate temperatures which may not unduly affect other device areas, such as the metal silicide regions 355 in the active region 304. For instance, nickel silicide may be efficiently formed at temperatures of 400° C. and less, which may be compatible with the metal silicide 355. Thus, a thickness of metal silicide in the conductive line 351 may be selected on the basis of enhanced conductivity for the conductive line, without being restricted to the penetration depth of metal silicide in shallow drain and source regions, such as the region 353. Hence, the formation of the metal silicide in the conductive line 351 or in other gate electrode structures may be decoupled from the process of forming the metal silicide regions 355 in the drain or source regions 353.

Figure 3D:
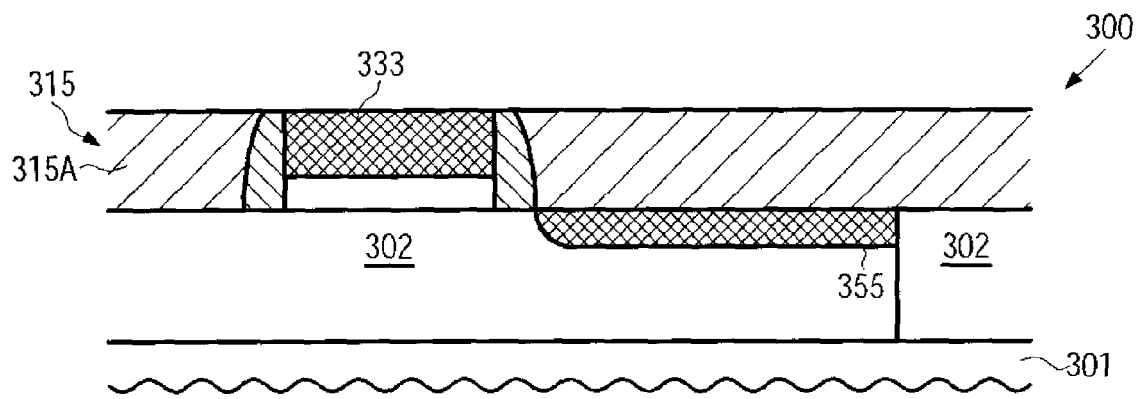

FIG. 3d schematically illustrates the semiconductor device 300 after the conversion of metal to metal silicide and removal of any excess material thereof. Thus, a metal silicide region 333 may be provided with a desired thickness.

Figure 3E:
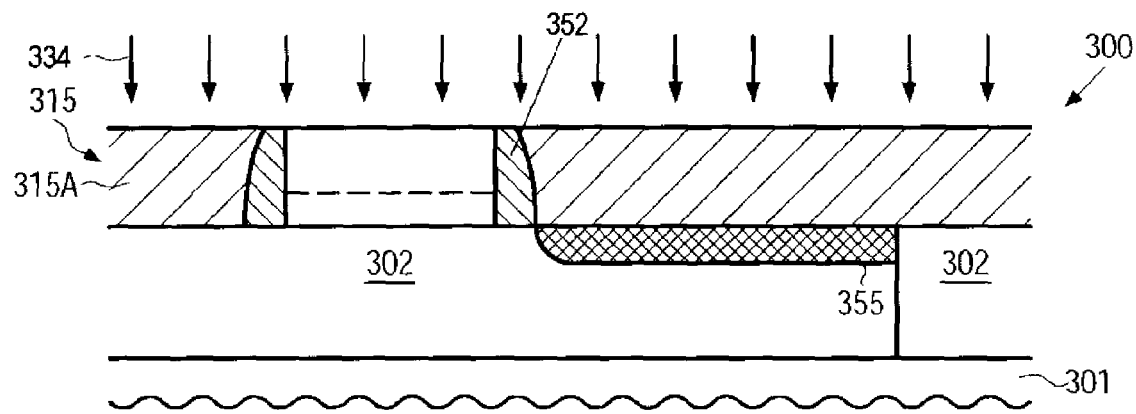

FIG. 3e schematically illustrates the semiconductor device 300 in a stage corresponding to FIG. 3b, wherein, if the formation of metal silicide on the basis of the heat treatment 332 is deemed inappropriate, material of the conductive line 351 may be selectively removed during a selective etch process 334. For this purpose, any appropriate wet chemical or plasma assisted etch recipe may be used, in which the material of the conductive line 351 may be selectively removed with respect to the spacers 352 and the sub-layer 315A, wherein these components may be comprised of silicon nitride and the like. In other illustrative embodiments, the conductive line 351 may be completely removed, possibly in combination with an insulating layer formed below (not shown), such as a gate insulation layer, and may be refilled with a highly conductive metal-containing material, if required. For example, metal silicides, tungsten-based materials and the like may be used for replacing material that is removed during the etch process 334, as indicated by the dashed line.

Figure 3F:
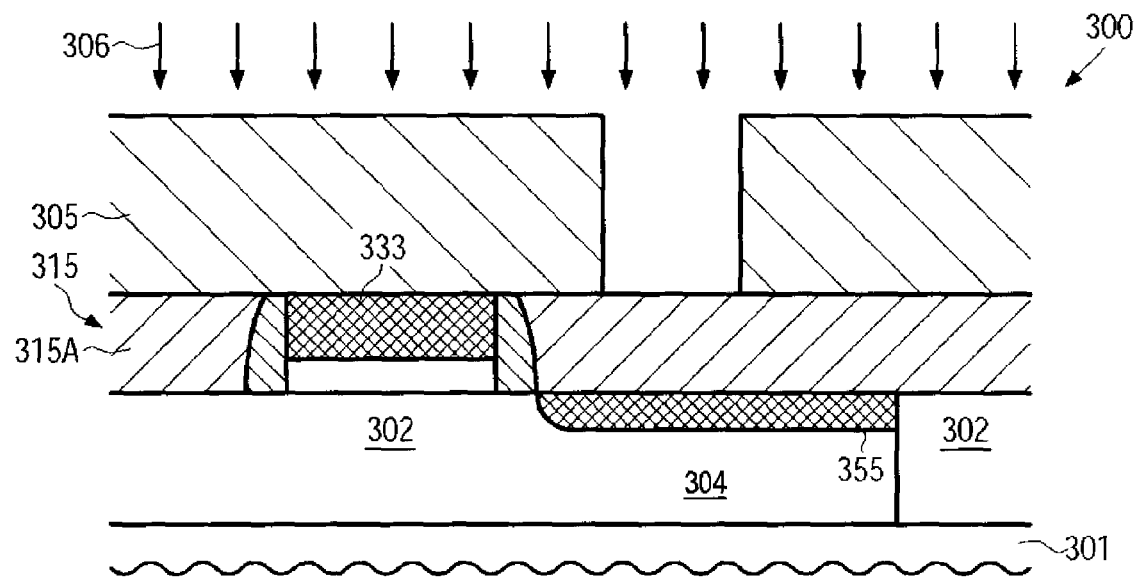

FIG. 3f schematically illustrates the semiconductor device 300 in a further advanced manufacturing stage in which an etch mask 305 for an etch process 306 is provided, wherein the etch process 306 may be performed with less critical constraints since the layer 315A may have a reduced thickness. Consequently, a respective opening connecting to a contact region of the active region 304, i.e., the metal silicide region 355, may be formed with high reliability due to significantly reduced aspect ratios, as is also explained above.

Figure 3G:
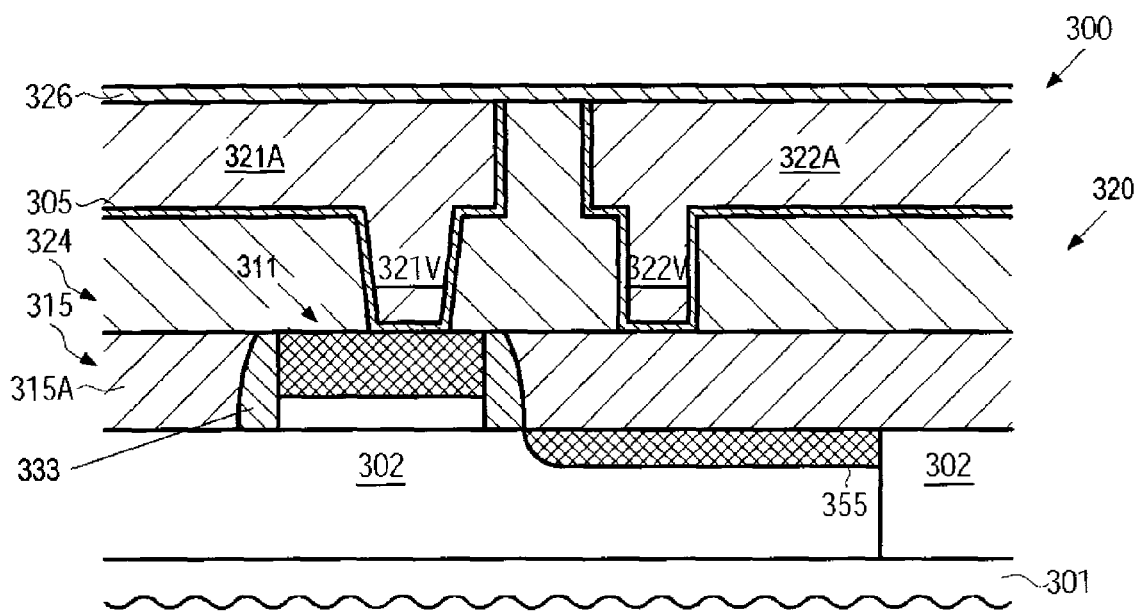

FIG. 3g schematically illustrates the semiconductor device 300 in a further advanced manufacturing stage in which the metallization layer 320 including the metal lines 321, 322 and the vias 321V, 322V is formed in the contact structure defined by the contact element 311 having substantially the same configuration as the contact element 211, except for an even further reduced aspect ratio. Furthermore, the via 321V may directly connect to the metal-containing region 333, wherein the low-k dielectric material 324 of the metallization layer 320 may provide the reduced parasitic capacitance.

Figure 3H:
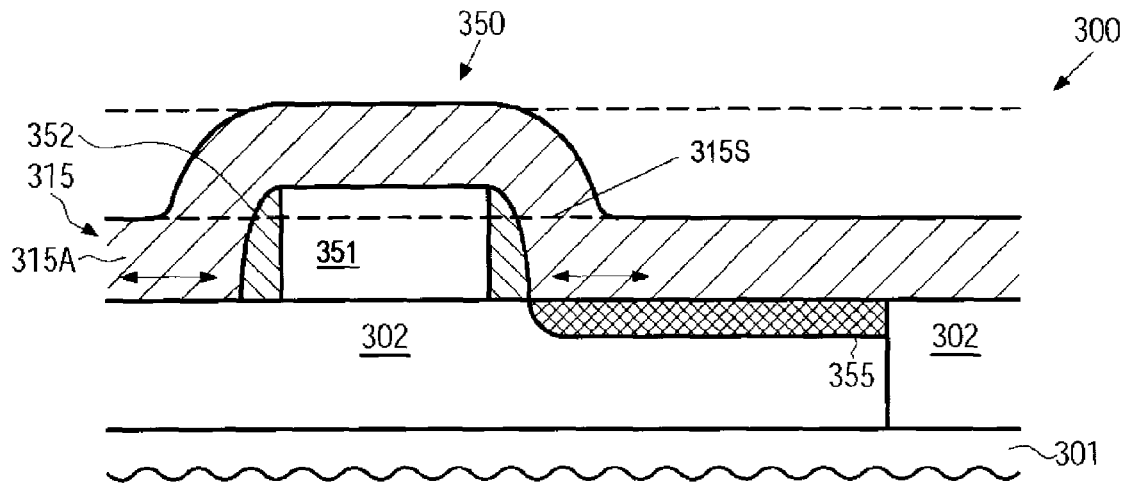
FIGS. 3h-3j schematically illustrate cross-sectional views of a semiconductor device during the formation of contact elements of low aspect ratio in combination with enhanced stress transfer mechanisms, according to still other illustrative embodiments.

FIG. 3h schematically illustrates the semiconductor device 300 according to further illustrative embodiments in which the layer 315A may be provided with high internal stress, for instance with tensile stress above an N-channel transistor and with high compressive stress above a P-channel transistor. It should be appreciated that tensile-stressed material and compressively-stressed material may be appropriately positioned above respective transistor elements on the basis of respective deposition and patterning regimes. Furthermore, as previously explained, a pronounced surface topography created by closely spaced conductive lines, such as the conductive line 351, may not be compatible with the fill capabilities of plasma enhanced deposition recipes for providing highly stressed silicon nitride material. Hence, the thickness of the layer 315A may have to be selected in accordance with constraints imposed by the deposition techniques, thereby requiring the provision of a lesser amount of the stressed material as would be desirable in view of transistor performance gain. In this case, a similar process technique as described above may be used, that is, a respective portion of the conductive line 351 may be removed during the process 330, wherein an appropriate sacrificial material 315, if required, may be deposited with enhanced gap filling capabilities to enhance the overall robustness of the corresponding removal process 330. Thus, the substantially planar surface topography 315S may be obtained, even with a reduced thickness of the layer 315A, thereby providing a highly stressed material adjacent to the conductive line 351. After the planarization, an appropriate highly conductive material may be formed in the remaining portion of the conductive line 351, for instance selectively etching and depositing a metal-containing material, as previously explained, or performing a respective silicidation process.

Figure 3I:
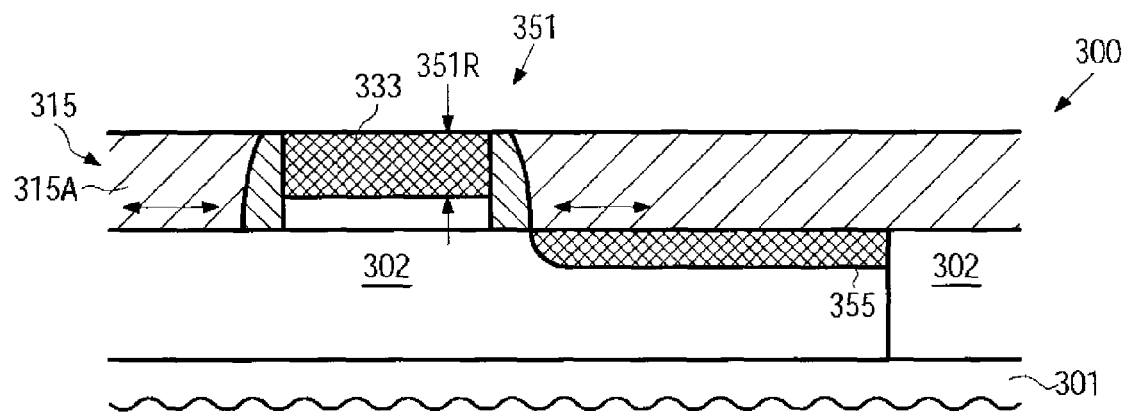

FIG. 3i schematically illustrates the device 300 after completion of the above-described process sequence. Hence, the conductive line 351 may comprise the highly conductive material 333 and may have a significantly reduced height 351R so that the highly stressed material of the layer 315A is positioned laterally adjacent to the conductive line 351.

Figure 3J:
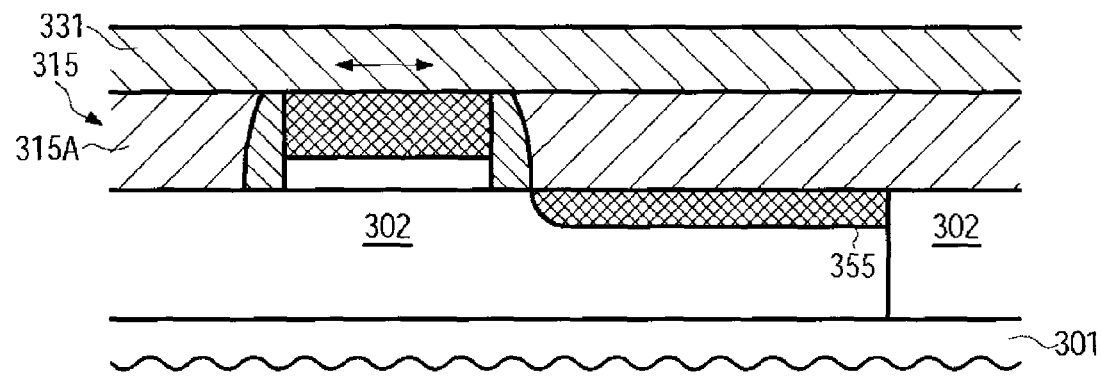

FIG. 3j schematically illustrates the semiconductor device in a further advanced manufacturing stage in which a further highly stressed dielectric material, such as silicon nitride and the like, may be deposited, wherein, in this case, any geometry-related constraints may be avoided due to the substantially planar surface topography provided by the structure as shown in FIG. 3i. Consequently, a desired amount of highly stressed material may be deposited, for instance, individually for N-channel transistors and P-channel transistors, without being restricted by the gap filling capabilities of the respective deposition process.

Thereafter, the further processing may be continued as is, for instance, shown in FIGS. 2c-2d in order to form respective contact elements of reduced aspect ratio followed by the formation of the metallization layer, which may now have a similar configuration as shown in FIG. 2a.

As a result, the present disclosure provides techniques for forming a low aspect ratio contact structure by forming contact elements on the basis of dielectric material having a reduced thickness, thereby enhancing overall process reliability for patterning and filling the corresponding contact openings. Thereafter, the first metallization layer may be formed on the basis of a dual damascene technique, thereby patterning vias and trenches, which are subsequently filled in a common deposition sequence to obtain enhanced overall process efficiency. Furthermore, overall process robustness may be enhanced, while at the same time the electrical performance of the contact structure may be improved due to reduced series resistance and reduced parasitic capacitance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first dielectric layer at least laterally adjacent to a circuit element, said circuit element having a sidewall and at least partially extending being partially formed above a semiconductor region having a first contact region defined by a top surface of said semiconductor region, wherein forming said first dielectric layer comprises depositing a first dielectric material, depositing a second dielectric material on said first dielectric material above said first dielectric material, said second dielectric material at least laterally enclosing a portion of said sidewall of said circuit element, and performing a planarization process using said first dielectric material for controlling said planarization process to form a planarized surface;
   forming a first contact element in said first dielectric layer to connect to said first contact region, wherein forming said first contact element comprises patterning said first dielectric material by means of an etch mask formed on said planarized surface so as to create a contact opening to expose said first contact region and filling said contact opening with a metal containing material, wherein said first contact element has a first height above said first contact region corresponding to a second height of said circuit element above said active region plus a thickness of said first-sub-layer disposed above said circuit element;

forming a second dielectric layer above said first dielectric layer, said second dielectric layer comprising a low-k dielectric material;

patterning said second dielectric layer to contain a via opening connecting to said first contact element and a trench connecting to said via opening; and filling said via opening and said trench in a common deposition process sequence to define a metal line in said trench and a via in said via opening connecting to said first contact element.

2. The method of claim 1, wherein said metal-containing material comprises tungsten.

3. The method of claim 1, further comprising forming a second contact element in said first dielectric layer, said second contact element connecting to a second contact region defined by a top surface of said circuit element.

4. The method of claim 3, wherein patterning said second dielectric layer further comprises forming a second via opening connecting to said second contact element and forming a second trench connecting to said second via opening.

5. The method of claim 1, wherein said via opening and said trench are filled with a copper-containing material.

6. The method of claim 3, further comprising forming a metal silicide region in said circuit element, wherein said second contact region is defined by a top surface of said metal silicide region.

7. The method of claim 1, wherein said circuit element represents a gate electrode structure of a transistor element.

8. A method for forming a contact structure of semiconductor device, the method comprising:

forming a low-k dielectric layer of a first metallization layer above a circuit element having a sidewall and at least partially extending above a semiconductor region and being embedded in a dielectric material comprising a first sub-layer formed above said circuit element and a second sub-layer formed above said first sub-layer and at least laterally enclosing said a portion of said sidewall of said circuit element, said dielectric material comprising a contact element connecting to a contact region of said circuit element, wherein a height of said contact element above said contact region substantially corresponds to a thickness of said first sub-layer above said circuit element is formed with a depth which is substantially defined by the thickness of the first sub-layer;

patterning said low-k dielectric layer to receive a via opening connecting to said contact element and a trench connecting to said via opening; and filling said via opening and said trench with a metal-containing material in a common fill process to define a metal line in said trench and a via in said via opening connecting to said first contact element.

9. The method of claim 8, wherein filling said via opening and said trench comprises depositing a conductive barrier material in said via opening and said trench and depositing a copper-containing material above said conductive barrier material.

10. The method of claim 8, wherein said circuit element represents a transistor element and said contact region is defined on a top surface of a gate electrode structure of said transistor element, said method further comprising forming said dielectric material by depositing a dielectric layer stack and performing a planarization process to planarize a surface of said dielectric layer stack.

11. A semiconductor device, comprising:

a line having a sidewall and at least partially extending above an active region;

a first contact region defined on a top surface of said active region;

a dielectric material comprising a first sub-layer formed above said active region and said line and a second sub-layer formed above said first sub-layer at least laterally enclosing a portion of said sidewall of said line;

a first contact element formed in said dielectric material and connecting to said first contact region, said first contact element having an aspect ratio of 5 or less, wherein said first contact element has a first height above said first contact region corresponding to a second height of said line above said active region plus a thickness of said first-sub-layer disposed above said line; and a first metallization layer formed above said dielectric material and comprising a low-k dielectric material and a first metal line and a first via, said first via connecting to said first contact element.

12. The semiconductor device of claim 11, further comprising:

a second contact region defined by a top surface of said line;

a second contact element formed in said dielectric material and connecting to said second contact region; and a second via in said first metallization layer, said second via connecting to said second contact element.

13. The semiconductor device of claim 11, wherein said first contact element comprises a first metal, and said first metal line and said first via comprise a second metal different than said first metal.

14. The semiconductor device of claim 13, wherein said first metal comprises tungsten and said second metal comprises copper.

15. The semiconductor device of claim 12, wherein said line comprises a silicide region, and said second contact region is defined by a top surface of said silicide region.

16. The semiconductor device of claim 12, further comprising a second metal line in said first metallization layer, said second metal line and said second via connecting to said second contact element.

17. The semiconductor device of claim 13, wherein said second metal extends continuously from said first metal line into said first via.

18. The semiconductor device of claim 11, wherein said first sub-layer comprises a stressed dielectric material.

19. A semiconductor device comprising:

a circuit element having a sidewall and at least partially extending above an active region;

a contact region formed on a top surface of said circuit element;

a dielectric material comprising a first sub-layer formed above said circuit element and a second sub-layer formed above said first sub-layer at least laterally enclosing a portion of said sidewall of said circuit element;

a first contact element formed in said dielectric material and connecting to said contact region, wherein a height of said first contact element above said contact region substantially corresponds to a thickness of said first sub-layer above said circuit element; and a first metallization layer formed above said dielectric material and comprising a low-k dielectric material and a metal line and a via, said via connecting to said first contact element.

20. The semiconductor device of claim 19, wherein said first contact element comprises a first metal and said metal line and said via comprise a second metal other than said first metal.

21. The semiconductor device of claim 20, wherein said first metal is tungsten and said second metal is copper.

22. The semiconductor device of claim 20, wherein said second metal extends continuously from said metal line into said via.

23. The semiconductor device of claim 19, wherein said circuit element comprises a silicide region, and said contact region is defined by a top surface of said silicide region.

24. The semiconductor device of claim 19, wherein said first sub-layer comprises a stressed dielectric material.

\* \* \* \* \*